United States Patent [19]

Kadomura

[11] Patent Number: 5,118,387
[45] Date of Patent: Jun. 2, 1992

[54] DRY ETCHING METHOD

[75] Inventor: Shingo Kadomura, Kanagawa, Japan

[73] Assignee: Sony Corporation, Tokyo, Japan

[21] Appl. No.: 770,329

[22] Filed: Oct. 3, 1991

[30] Foreign Application Priority Data

Oct. 4, 1990 [JP] Japan ................................ 2-265235

[51] Int. Cl.$^5$ ............................................ H01L 21/00
[52] U.S. Cl. .................................... 156/657; 156/643;
156/646; 156/656; 156/662; 156/664
[58] Field of Search ............... 156/643, 646, 656, 657,
156/662, 664

[56] References Cited

U.S. PATENT DOCUMENTS

| | | | |
|---|---|---|---|
| 4,778,563 | 10/1988 | Stone | 156/659.1 |
| 4,784,720 | 11/1988 | Douglas | 156/646 |
| 4,799,991 | 1/1989 | Dockrey | 156/662 |
| 4,818,334 | 4/1989 | Shwartzman et al. | 156/662 |
| 4,997,520 | 3/1991 | Jucha et al. | 156/643 |
| 5,013,398 | 5/1991 | Long et al. | 156/646 |

FOREIGN PATENT DOCUMENTS 61-015500 1/1986 Japan .

Primary Examiner—David A. Simmons
Assistant Examiner—George A. Goudreau
Attorney, Agent, or Firm—Hill, Van Santen, Steadman & Simpson

[57] ABSTRACT

A method for anisotropic etching of a polycide film without using chlorofluorocarbon (CFC) gas. If the polycide film is etched using a $S_2F_2$/HBr gas mixture, as the temperature of a sample wafer is controlled to be not higher than room temperature, sulfur yielded in a plasma on dissociation due to electric discharge of $S_2F_2$ is also deposited besides $SiBr_x$ which is a reaction product of etching. The result is that, even if the amount of $SiBr_x$ is diminished during over etching, sidewall protection may be sustained due to the presence of sulfur, so that no undercuts are produced in the lower polysilicon layer. Alternatively, the $SF_8$/HBr gas mixture may be used up to so-called just-etching if the gas composition is switched to $H_2S$/HBr for overetching. In such case, a high etchrate may be achieved during just-etching, while high anisotropy may be achieved during overetching due to progress of capturing of excess Br* by H* and deposition of sulfur.

5 Claims, 1 Drawing Sheet

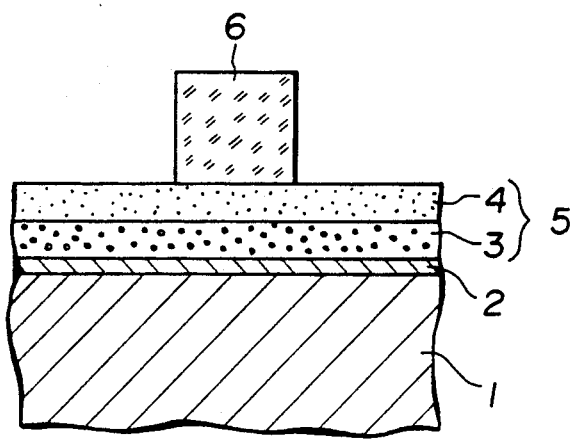
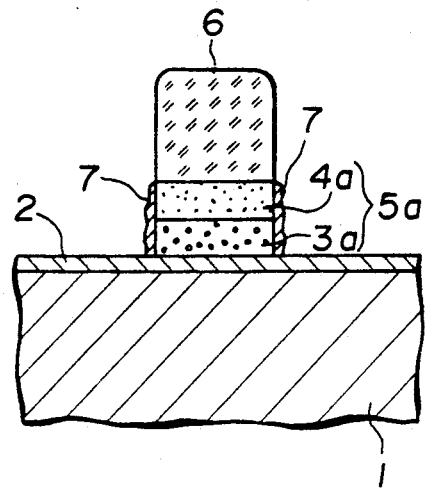
FIG.1(A) FIG.1(B)
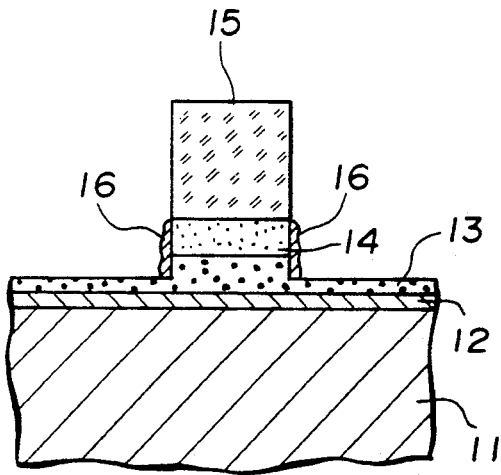
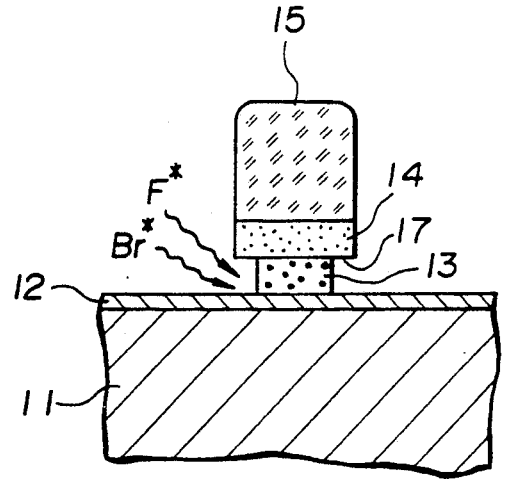
FIG.2(A) FIG.2(B)

DRY ETCHING METHOD

BACKGROUND OF THE INVENTION

1. Field of the Invention

This invention relates to a dry etching method used for production of semiconductor devices exhibiting a high integration degree. More particularly, it relates to a method for anisotropic etching of a polycide film used in a gate electrode or the like without using a chlorofluorocarbon gas, referred to hereinafter as a CFC gas.

2. Description of Related Art

Polysilicon has hitherto been used extensively as a gate electrode material for LSIs. However, in keeping up with a demand for a high speed operation, such as a shorter access time in a memory device with a high integration degree, silicides of a refractory metal, having a resistance value about one digit lower than that of the polysilicon, have come to be used. For constructing the gate electrode layer with the use of the silicide of refractory metals, a so-called polycide film structure is predominantly employed, in which, in consideration of interfacial characteristics with the gate insulating film which are most likely to affect the characteristics of the device and operational reliability, a doped polysilicon (DOPOS) layer, exhibiting proven effects, is formed on the gate insulating film, and a layer of a polycide of refractory metals is formed on the DOPOS layer.

However, such polycide film has presented new difficulties in the art of dry etching, because it has to exhibit anisotropy with respect to both of two different materials. That is, on etching the polycide film, undercuts or constrictions tend to be produced in a pattern because a lower layer of polysilicon is etched more promptly than an upper layer of the refractory metal silicide due to the differential vapor pressure of produced halogen compounds, and also because a reaction layer is formed in an interface between the polysilicon layer and the refractory metal silicide. These shape abnormalities tend to produce offset regions obstructing introduction of impurities at the time of an ion implantation carried out for formation of a source-drain region, as well as to lower dimensional accuracy at the time of a formation of a sidewall carried out for realization of an LDD structure, and hence are not allowable particularly with submicron size devices.

Heretofore, a CFC gas, such as CFC 113 ($C_2Cl_3F_3$) has been used most extensively as an etching gas for policide films, as reported for example in Semiconductor World, issued by Press Journal Inc., 1989, October, pages 126 to 130. This gas, containing chlorine and fluorine atoms in its molecule, allows an etching reaction to proceed efficiently in both the radical mode and the ion mode, and enables high anisotropy etching simultaneously with sidewall protection due to deposition of a carbonaceous polymer.

However, the CFC gas has been pointed out as destroying an ozone layer of the earth and its production and use are scheduled to be banned in the near future. Thus it is mandatory to find a suitable substitute of the CFC gas in the field of dry etching and to establish a method for its effective utilization, that is, a process in which the CFC gas is not used.

In view of demands for refinement of device size and for finding a substitute for CFC gas, HBr has recently attracted attention as an etching gas. For example, it has been reported in Digest of Papers 1989 Second Micro-Process Conference page 190 that a satisfactory shape anisotropy has been achieved by a reactive ion etching of an $n^+$ type polysilicon layer with the use of HBr. Br is an etchant highly effective for achieving aniosotropy because it is capable of producing an etching reaction when aided by ion bombardment, even though it has a larger atomic radius and cannot intrude into crystal lattices or grain boundaries of a material to be etched and hence it cannot produce a spontaneous etching reaction without difficulties.

However, it has been found that dry etching with HBr presents problems when used for etching the polycide film because bromides of the refractory metals sputtered out during etching of the refractory metal silicide layer contaminate an etching chamber. Further because Br radicals are intrinsically low in reactivity when used as an etchant, the etch rate is markedly lowered as compared to that when a conventional CFC gas is used for etching.

For overcoming these problems, a group of researchers, of which the present inventor is a member, has made a report on a dry etching method for a polycide film by an etching gas including HBr admixed with fluorine-containing gases, such as $SF_6$ (Extended Abstracts, second volume, page 460, title number 28p-ZF-3, in 37th Spring Meeting (1990) of the Japan Society of Applied Physics and Related Societies; and extended papers, second volume, page 463, title number 26p-ZF-3, in the 51th Autumn Meeting (1990), of the Japan Society of Applied Physics). It is envisaged to effect etching with this etching gas at a reasonable speed by supply of F* as well as to achieve high anisotropy by the effect of sidewall protection by a reaction product $CBr_x$. In the above report, reference has been made to overetching with only HBr after the etching of the polycide film is well-nigh terminated. It is envisaged to eliminate the polycide film from the wafer in its entirety without markedly lowering the overall etch rate while maintaining a larger selectivity with the gate oxide film.

Meanwhile, in the field of dry etching, a so-called low temperature etching, in which a substrate to be etched is maintained at 0° C. or lower during etching, has recently attracted attention. It is intended with the low temperature etching to prevent shape defects, such as side etching, by terminating or restraining a radical reaction at a sidewall section, with an etch rate along the depth being maintained by an ion assist effects. If the technique is used for etching of the polycide film by $SF_6$/HBr gas system, the reaction product $SiBr_x$ may be deposited besides the reaction product of the resist material with Br and may be utilized as a sidewall protection film.

However, subsequent researches have revealed that problems are left to be solved in the practical utilization of dry etching making use of a mixed gas of a fluorine gas typified by $SF_6$/HBr and HBr.

In the first place, etching at room temperature presents problems in that high anisotropy cannot be attained, unless the proportion of HBr in the etching gas is high to some extent, so that the etch rate is essentially low. On the other hand, if the proportion of HBr is raised to make much of anisotropy and accordingly a large quantity of the reaction product $SiBr_x$ is produced, the latter tends to be deposited on the sidewall etc. of the resist pattern. The reaction product which is left after removal of the resist pattern by ashing tends to be dislocated to cause particle pollution. Since HBr itself is a dangerous and highly hygroscopic compound, process stability may be affected if HBr is used in larger quantities.

In the second place, undercuts may be produced in the polysilicon layer during overetching.

This phenomenon is explained by taking an example of a process for formation of a polycide gate electrode shown in FIGS. 2A and 2B. Referring to FIG. 2A, an doped polysilicon layer 13 and a refractory metal silicide layer 14 containing a refractory metal, such as tungsten, are sequentially deposited on a semiconductor substrate 11 of silicon etc. with an interposition of a gate insulating film 12, and the so-formed substrate is subjected to dry etching, using $SF_6$/HBr as an etching gas and using a prepatterned photoresist pattern 15 as a mask, until the polysilicon layer 13 is etched by about one-half its depth. At this stage, a sidewall protection film 16 is deposited on sidewalls of the refractory metal silicide layer 14 and the polysilicon layer 13 for maintaining shape anisotropy. The sidewall protection film 16 is made up e.g. of reaction products between Br and the resist material of the photoresist pattern 15, or $SiBr_x$ which is a reaction product between Br and Si which is mainly supplied from the polysilicon layer 13.

However, when etching is well-nigh terminated and overetching is started, the polysilicon layer 13 as a Si source is decreased, so that the deposited amount of $SiBr_x$ is decreased. Moreover, Br* which is in excess relatively due to loss of counterparts of bonding tends to attack the sidewall section of the polysilicon layer 13. This produces an undercut 17, as shown in FIG. 2B, so that the pattern width of the polysilicon layer 13 becomes narrower than the desired pattern width. Under certain situations, these undercuts may be produced by the raised etch rates at the time point when etching of the refractory metal silicide layer 14 is terminated and the surface of the polysilicon layer 13 is exposed. Such phenomenon cannot be suppressed effectively by application of low temperature etching.

Switching the etching gas to a composition consisting solely of HBr for overetching for preventing the undercuts has been proposed by the group of researchers, of which the present inventor is a member. Similar effects may also be achieved by switching the gas composition on exposure of the polysilicon layer. However, since etchants are present in excess amount during overetching, it is necessary to provide more intensive sidewall protection than in the course of intrinsic etching. The above mentioned switching technique is not fully satisfactory in this respect. In addition, difficulties are raised as to end-point detection in switching the gas composition at an interface between the refractory metal silicide layer and the polysilicon layer. It is because no useful emission species of refractory metal halides have been known in the measurement of an emission spectrum which is usually employed for monitoring dry etching.

OBJECT AND SUMMARY OF THE INVENTION

It is a principal object of the present invention to overcome the above problems and to provide a process for dry etching in which a CFC gas is not used and in which undercuts may be prevented from being produced during etching of the polycide film.

The present inventor has conducted researches on the basis of an assumption that sidewall protection becomes possible without regard to the presence or absence of the layer of a material to be etched if a component derived from the etching gas and not the layer of the material to be etched is deposited at least during overetching. As a result, the present inventor has found that, by using a gas system capable of depositing sulfur at lower temperatures, etching may be expedited and deposition shortage of $SiBr_x$ may be compensated to prevent undercuts from being produced by sufficient sidewall protective effects.

The present inventor has also found that the above gas system may be effectively used not only through the entire etching process but also only during overetching.

For sulfur deposition throughout the entire process, a polycide film is etched using an etching gas containing HBr and at least one of sulfur fluorides selected from the group consisting of $S_2F_2$, $SF_2$, $SF_4$ and $S_2F_{10}$ as the temperature of the etched substrate is controlled to be not higher than room temperature. As a gas to be mixed with HBr, at least one of the compounds selected from the group consisting of various sulfur fluorides, such as $S_2F_2$, $SF_2$, $SF_4$ and $S_2F_{10}$ having a lower F/S ratio (ratio of the number of fluorine atoms to that of sulfur atoms in one molecule) is used in place of conventionally employed $SF_6$. These sulfur fluorides have been reported by the present inventor in Extended Abstracts, second volume, in the 38th Spring Meeting 1991 of the Japan Society of Applied Physics and Related Societies, page 503, title number 28p-ZC-13, or MicroProcess '91, title number A-3-1. These compounds are dissociated during etching into species and sulfur species in a plasma to furnish a fluorine radical F* as an etchant, while causing sulfur S to be deposited at lower temperatures. Thus the sidewall protecting effects may be replenished by sulfur deposition even if deposition shortage of $SiBr_x$ occurs during overetching. Conversely, with conventionally used $SF_6$, free sulfur is not liberated, so that the above effects cannot be expected, as has been ascertained by the author's separate experiments.

On the other hand, since the relative content of HBr in the etching gas may be lowered in inverse proportion to the deposited amount of sulfur, excess $SiBr_x$ may be prevented from being deposited on the sidewall of the resist pattern, while process stability or etch rate may be improved.

For depositing sulfur only during overetching, a polycide film is etched using an etching gas containing a fluorine compound and HBr as the substrate to be etched is cooled to a temperature lower than the room temperature. Over etching is then performed using an etching gas containing $H_2S$ and HBr.

In sum, an etching gas containing fluorine gas such as $SF_6$ and HBr as before is used until etching of the polycide film is well-nigh completed and $H_2S$ is added in place of the fluorine gas during subsequent over etching. $H_2S$ is dissociated in plasma into hydrogen radical H* and sulfur S to capture Br* by the H* while causing sulfur to be deposited under a lower temperature. In this manner, undercuts may be prevented from being produced during overetching.

With any of these methods, sidewall protection effects may be intensified by deposited sulfur at least during overetching, so that there is no risk of undercuts being produced in the polysilicon layer. Thus the present invention provides a highly useful CFC-free dry etching method for a polycide film.

BRIEF DESCRIPTION OF THE DRAWINGS

FIGS. 1A and 1B are schematic cross-sectional views for illustrating the dry etching process of the present invention as applied to formation of a polycide gate electrode, step by step, wherein FIG. 1A shows a step of forming a gate oxide film, a polycide film and a photoresist pattern and FIG. 1B shows a step of etching the polycide film.

FIGS. 2A and 2B are schematic cross-sectional views for illustrating the conventional dry etching process of a polycide film, wherein FIG. 2A shows the polysilicon layer etched by half its depth and FIGS. 2B shows the state of undercut produced during over etching.

DETAILED DESCRIPTION OF THE INVENTION

By referring to the drawings, certain preferred embodiment of the present invention will be explained in detail.

EXAMPLE 1

In the present example, a polycide gate electrode is formed using an $S_2F_2$/HBr gas mixture, based on a concept of depositing sulfur throughout the entire etching process. This process will be explained by referring to FIGS. 1A and 1B.

Referring first to FIG. 1A, a gate oxide film 2 of, for example, silicon oxide, a polysilicon layer 3 doped with n-type impurities, and a tungsten silicide layer 4, are formed step by step on a semiconductor substrate 1 formed of, for example, single crystal silicon. The layers 3 and 4 represent lower and upper layers of a polycide film 5. A photoresist pattern 6 is then formed selectively on the surface of the tungsten silicide layer 4 as an etching mask for the polycide film 5.

The substrate was then set in an RF bias impressing type microwave plasma etching device which is adapted for operating in a magnetic field and which is provided with a cooling system for controlling the temperature of a substrate to be etched or a wafer to a temperature not higher than 0° C. Then, using liquid nitrogen, the substrate to be etched was cooled to about $-100°$ C. The cooling system may be of any type, such as a system in which a piping system for circulation of a cooling medium or a Peltier element are accommodated in a wafer mounting electrode or a system in which the wafer mounting electrode is dipped in a vessel filled with the cooling medium.

Etching was then performed close to an etching end point under operating conditions of an $S_2F_2$ flow rate of 35 SCCM, an HBr flow rate of 15 SCCM, a gas pressure of 1.3 Pa (=10 mTorr), a microwave power of 850 W, an RF bias power of 30 W (2 MHz) and a substrate temperature during etching of $-50°$ C. Under these conditions, an etching reaction, mainly a radical reaction, proceeded at a fast rate, so that a gate electrode 5a having a pattern width of 0.35 μm was formed with satisfactory anisotropy, whilst a sidewall protection film 7 was formed on sidewalls of at least a tungsten silicide pattern 4a and a polysilicon pattern 3a as shown in FIG. 1B. The sidewall protection film 7 is formed of a mixture of a polymer formed by the photoresist pattern 6 sputtered out by Br+, $SiBr_x$ generated by reaction with Br of Si supplied from the polycide film 5 and sulfur produced by dissociation of $S_2F_2$, which are deposited on the sidewalls at a lower temperature.

Over etching was then performed under the same conditions for removing the polysilicon layer 3 remaining on a region, not shown. Since a sufficient deposition of $SiBr_x$ cannot be expected during this process, undercut as shown in FIG. 2B would be produced immediately in the polysilicon pattern 3a with the conventional technique. However, with the present embodiment, a satisfactory shape anisotropy as shown in FIG. 1B could be maintained due to deposition of sulfur yielded by dissociation of $S_2F_2$.

Meanwhile, the above mentioned etching conditions are more favorable in the following respects than the etching in the conventional $SF_6$/HBr system. In the first place, since the ratio of HBr in the etching gas may be reduced to an extent that sulfur deposition may be expected, the process may be stabilized and expedited. Since deposition of $SiBr_x$ on the sidewall of the photoresist pattern 6 may be reduced in this manner, particle contamination may be prevented. Anisotropic processing under a lower bias than in the conventional system becomes possible to reduce etching damages as well as to improve selectivity with respect to the substrate. Meanwhile, sulfur forming a part of the sidewall protection film 7 may be sublimated off by heating the substrate to approx. 90° C. after termination of etching.

It is to be noted that the present invention is not limited to the above described embodiment. For example, $N_2$ or $O_2$ may be added to the etching gas to augment the effect of sidewall protection or to control the rate of etching. Rare gases such as Ar or He may be suitably added in expectation of sputtering, diluting or cooling effects.

Although tungsten silicide is used in the above embodiment as a refractory metal silicide forming an upper layer of the polycide film 5, silicide(s) of other refractory metals, such as molybdenum, titanium or tantalum, may also be used besides tungsten silicide.

EXAMPLE 2

In the present example, a polycide gate electrode is formed by etching a major part of the polycide film with the use of a $SF_6$/HBr gas mixture, followed by overetching with $H_2S$/HBr gas, based on a concept of allowing sulfur to be deposited only during overetching. The present example will be explained by referring to FIGS. 1A and 1B referred to in the preceding example.

The substrate shown in FIG. 1A was set on an RF bias impressing type microwave plasma etching device operating in a magnetic field. Etching was then performed close to an etching end point under operating conditions of an $S_2F_2$ flow rate of 30 SCCM, and HBr flow rate of 20 SCCM, a gas pressure of 1.3 Pa(=10 mTorr), a microwave power of 850 W, an RF bias power of 50 W (2 MHz) and a substrate temperature during etching of $-50°$ C. Under these conditions, an etching reaction, mainly a radical reaction, proceeded at a fast rate so that a gate electrode 5a having a pattern width of 0.35 μm was formed with satisfactory anisotropy, whilst a sidewall protection film 7 was formed on sidewalls of at least a tungsten silicide pattern 4a and a polysilicon pattern 3a as shown in FIG. 1B.

A second etching was then performed, by way of an over etching, under the same conditions as those for the first etching, except changing the gas supplying conditions to an $H_2S$ flow rate of 20 SCCM and an HBr flow rate of 30 SCCM. During this process, the yielded amount of $SiBr_x$ is markedly reduced, while Br* is in corresponding excess. However, since sulfur yielded on dissociation of $H_2S$ in plasma is deposited on the sidewall of the gate electrode 5a to provide additional sidewall protecting effects and excess Br* captured by hydrogen produced on dissociation of $H_2S$, undercuts may be prevented from being produced highly effectively.

It is noted that, although $SF_6$ is used in the above examples as fluorine compound for the first etching, $NF_3$, $ClF_3$, $F_2$ or HF may also be employed. The amount of addition of HBr to these fluorine compounds is preferably in an order of 10 to 50%. If the amount is less or more than this range, the effect of sidewall protection falls short or the rate of etching is lowered, respectively.

In addition, the refractory metal silicide layer constituting the polycide film may also be of titanium silicide, molybdenum silicide or tantalum silicide, besides the aforementioned layer of tungsten silicide.

What is claimed is:

1. A dry etching method comprising etching a polycide film composed of a refractory metal silicide layer and a polysilicon layer, using an etching gas containing at least HBr and at least one sulfur fluoride selected from the group consisting of $S_2F_2$, $SF_2$, $SF_4$, and $S_2F_{10}$, while the temperature of a substrate to be etched is controlled to be lower than room temperature.

2. The dry etching method as claimed in claim 1 characterized in that said refractory metal silicide layer is selected from the group consisting of a tungsten silicide layer, a titanium silicide layer, molybdenum silicide layer and a tantalum silicide layer.

3. A dry etching method comprising a first etching step of etching a polycide film comprised of a refractory metal silicide layer and a polysilicon layer, using an etching gas containing HBr and a fluorine compound, while the temperature of a substrate to be etched is controlled to be lower than room temperature, and a second step of over etching with an etching gas containing $H_2S$ and HBr.

4. The dry etching method as claimed in claim 3 characterized in that said fluorine compound is selected from the group consisting of $SF_6$, $NF_3$, $ClF_3$, $F_2$ and HF.

5. The dry etching method as claimed in claim 3 characterized in that said refractory metal silicide layer is selected from the group consisting of a tungsten silicide layer, a titanium silicide layer, molybdenum silicide layer and a tantalum silicide layer.

* * * * *